United States Patent
Leeser et al.

(10) Patent No.: US 12,315,705 B2
(45) Date of Patent: May 27, 2025

(54) DISTORTION OF PULSES FOR WAFER BIASING

(71) Applicant: Lam Research Corporation, Fremont, CA (US)

(72) Inventors: Karl Frederick Leeser, West Linn, OR (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/682,061

(22) PCT Filed: Aug. 9, 2022

(86) PCT No.: PCT/US2022/074721
§ 371 (c)(1),
(2) Date: Feb. 7, 2024

(87) PCT Pub. No.: WO2023/019145
PCT Pub. Date: Feb. 16, 2023

(65) Prior Publication Data
US 2024/0266153 A1    Aug. 8, 2024

Related U.S. Application Data

(60) Provisional application No. 63/260,216, filed on Aug. 12, 2021.

(51) Int. Cl.
*H01J 37/32* (2006.01)

(52) U.S. Cl.
CPC .. *H01J 37/32697* (2013.01); *H01J 37/32715* (2013.01)

(58) Field of Classification Search
None
See application file for complete search history.

(56) References Cited

U.S. PATENT DOCUMENTS

| | | | |
|---|---|---|---|
| 2005/0057881 A1* | 3/2005 | Qin | H01L 21/6833 361/234 |
| 2015/0325413 A1* | 11/2015 | Kim | H01J 37/32082 315/111.21 |

(Continued)

FOREIGN PATENT DOCUMENTS

| | | |
|---|---|---|
| JP | 2007142444 A | 6/2007 |
| KR | 20180012060 A | 2/2018 |

OTHER PUBLICATIONS

Franklin, G., et al., "Digital control of dynamic systems," Second edition, pp. 251-252, 261, 444-445.

(Continued)

*Primary Examiner* — Binh X Tran
(74) *Attorney, Agent, or Firm* — Weaver Austin Villeneuve & Sampson LLP (57) ABSTRACT

Various embodiments herein relate to apparatuses and methods for distortion of pulses for wafer biasing. In some embodiments, a method is provided, the method comprising: causing a distorted pulse to be applied to an electrode of a pedestal such that the distorted pulse at least partially compensates for attenuation between the pedestal and the substrate, and such that a waveform resulting from the distorted pulse, when imparted to the substrate, is substantially square.

27 Claims, 8 Drawing Sheets

Pre-Distorted Pulse — Transfer Function — Delayed and square pulse imparted to wafer (56) References Cited

U.S. PATENT DOCUMENTS

| | | | | |
|---|---|---|---|---|
| 2017/0330730 | A1* | 11/2017 | Kubota | H01J 37/32082 |
| 2017/0358428 | A1 | 12/2017 | Kawasaki et al. | |
| 2017/0365445 | A1 | 12/2017 | Kubota | |
| 2019/0180982 | A1* | 6/2019 | Brouk | H01J 37/32009 |
| 2020/0335305 | A1 | 10/2020 | Long et al. | |
| 2022/0223377 | A1* | 7/2022 | Driessen | H01J 37/32706 |
| 2022/0367158 | A1* | 11/2022 | Cui | H01J 37/32715 |
| 2022/0392750 | A1* | 12/2022 | Yang | H01J 37/32146 |
| 2022/0406568 | A1* | 12/2022 | Tamamushi | H01J 37/32146 |
| 2022/0415615 | A1* | 12/2022 | Cubaynes | H03K 17/6871 |

OTHER PUBLICATIONS

International Search Report and Written Opinion dated Nov. 29, 2022 in PCT Application No. PCT/US2022/074721.
Ogata, et al., "Modern Control Engineering," Second edition, pp. 795, 796, 808, 809.
International Preliminary Report on Patentability and Written Opinion dated Feb. 22, 2024 in PCT Application No. PCT/US2022/074721.

* cited by examiner

DISTORTION OF PULSES FOR WAFER BIASING

RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety.

BACKGROUND

It may be desirable to impart high slew rate pulses onto a wafer undergoing a plasma fabrication process. For example, application of a high slew rate pulse can be used to select a mass species from a plasma cloud that is attracted to or repelled from a substrate. However, it may be difficult to impart high slew rate pulses onto a wafer. Moreover, it may be difficult to control parameters of high slew rate pulses.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor implicitly admitted as prior art against the present disclosure.

SUMMARY

Disclosed herein are apparatuses and methods for distortion of pulses for wafer biasing.

In accordance with some embodiments, a method for applying DC pulses to a substrate is provided, the method comprising: causing a distorted pulse to be applied to an electrode of a pedestal such that the distorted pulse at least partially compensates for attenuation between the pedestal and the substrate, and such that a waveform resulting from the distorted pulse, when imparted to the substrate, is substantially square.

In some examples, the distorted pulse, when imparted to the substrate, has a slew rate within a range of about 400 Volts/microsecond-600 Volts/microsecond.

In some examples, the method further comprises obtaining one or more parameters, wherein the distorted pulse is generated based at least in part on the one or more parameters. In some examples, obtaining the one or more parameters comprises retrieving the one or more parameters from a memory associated with a controller that causes the distorted pulse to be applied.

In some examples, the distorted pulse is generated based at least in part on a transfer function indicative of the attenuation between the pedestal and the substrate. In some examples, the transfer function is updated on a periodic or continuous basis, and wherein a second distorted pulse is generated based at least in part on the updated transfer function. In some examples, the transfer function is updated based on one or more measurements associated with an apparatus in which the pedestal is disposed. In some examples, the transfer function is updated using a real-time estimator that utilizes the one or more measurements. In some examples, parameters associated with a pulse generator that applies the distorted pulse and the second distorted pulse is updated based at least in part on the one or more measurements.

In some examples, a rising edge of the distorted pulse overshoots a rising edge of the waveform resulting from the distorted pulse and/or a falling edge of the distorted pulse undershoots a falling edge of the waveform resulting from the distorted pulse.

In some examples, the method further comprises determining a time shift at which the distorted pulse is to be applied to the electrode based at least in part on a time delay associated with propagation of the distorted pulse, wherein causing the distorted pulse to be applied to the electrode comprise causing the distorted pulse to be applied to the electrode at the shift determined.

In some examples, the attenuation is of high-frequency components.

In some examples, the substrate is a semiconductor wafer.

In some examples, the pedestal is a pedestal of an electrostatic chuck (ESC).

In accordance with some embodiments, an apparatus for applying DC pulses to a substrate is provided, the apparatus comprising at least one controller that is configured to: cause a distorted pulse to be applied to an electrode of an Electrostatic Chuck (ESC) such that the distorted pulse at least partially compensates for attenuation between the ESC and the substrate, and such that a waveform resulting from the distorted pulse, when imparted to the substrate, is substantially square.

In some examples, the at least one controller is further configured to obtain one or more parameters, wherein the distorted pulse is generated based at least in part on the one or more parameters. In some examples, obtaining the one or more parameters comprises retrieving the one or more parameters from a memory associated with the controller. In some examples, the one or more parameters are determined based at least in part on the transfer function indicative of the attenuation between the ESC and the substrate. In some examples, the one or more parameters cause a rising edge of the distorted pulse to overshoot a rising edge of the waveform resulting from the distorted pulse and/or cause a falling edge of the distorted pulse to undershoot a falling edge of the waveform resulting from the distorted pulse.

In some examples, the distorted pulse is generated using a broad spectrum amplifier. In some examples, the broad spectrum amplifier is configured to boost high-frequency components of the pulse to be imparted to the substrate.

In some examples, the controller is part of a power supply associated with the ESC.

In some examples, the controller is further configured to determine a time shift at which the distorted pulse is to be applied to the electrode based at least in part on a time delay associated with propagation of the distorted pulse, wherein causing the distorted pulse to be applied to the electrode comprises causing the distorted pulse to be applied to the electrode at the shift determined.

In some examples, the substrate is a semiconductor wafer.

In accordance with some embodiments, a method for applying DC pulses to substrates is provided, the method comprising: characterizing a transfer function indicative of attenuation between pedestal and a substrate; and identifying one or more parameters to modify a shape of a pulse to be imparted to the substrate as a distorted pulse, such that the distorted pulse at least partially compensates for the attenuation between the pedestal and the substrate, and such that a waveform resulting from the distorted pulse, when imparted to the substrate via an electrode of the pedestal, is substantially square.

In some examples, the one or parameters are identified to boost high-frequency components of the pulse to be imparted to the substrate as the distorted pulse.

In some examples, the one or more parameters are identified such that a rising edge of the distorted pulse overshoots a rising edge of the waveform resulting from the distorted pulse and/or such that a falling edge of the distorted pulse undershoots a falling edge of the waveform resulting from the distorted pulse.

In some examples, the method further comprises identifying, based on the transfer function, a time delay associated with the input signal, wherein the one or more parameters comprise a time shift in application of the distorted pulse to the electrode that is determined based on the time delay.

In some examples, the transfer function is based on a plasma impedance model.

In some examples, the transfer function indicates a low-pass filtering effect of a platen of the ESC and/or the substrate positioned on the upper surface of the platen, and wherein the one or more parameters compensate for the low-pass filtering effect.

In some examples, the transfer function is characterized by at least one of: direct measurement of parameters associated with a response of the pedestal to an input signal applied to the electrode of the pedestal, lumped parameter modeling, parameter estimate, computational simulation, system identification, and/or a machine learning model.

In some examples, characterizing the transfer function comprises applying at least one of a computational simulation or a machine learning model to an estimate of the transfer function that is based at least in part on a plasma impedance model.

In some examples, the method further comprises identifying one or more pulse parameters based on a fabrication process associated with the substrate, wherein the one or more parameters to modify the shape of the pulse are identified based at least in part on the one or more pulse parameters. In some examples, the one or more pulse parameters are identified to select a mass species attracted to or repelled from the substrate as part of the fabrication process. In some examples, the one or more pulse parameters comprise at least one of a pulse duration or a pulse amplitude.

In some examples, the substrate is a semiconductor wafer.

In accordance with some embodiments, a method for applying periodic waveforms to substrates is provided, the method comprising causing a distorted pulse to be applied to an electrode associated with a pedestal such that the distorted pulse at least partially compensates for attenuation between the pedestal and the substrate, and such that a waveform resulting from the distorted pulse, when imparted to the substrate, has a desired shape that is different from a shape of the distorted pulse.

In some examples, the distorted pulse is generated based at least in part on a transfer function indicative of the attenuation between the pedestal and the substrate.

In some examples, a rising edge of the distorted pulse overshoots a rising edge of the waveform resulting from the distorted pulse and/or wherein a falling edge of the distorted pulse undershoots a falling edge of the waveform resulting from the distorted pulse.

In some examples, the method further comprises determining a time point at which the distorted pulse is to be applied to the electrode, wherein causing the distorted pulse to be applied to the electrode comprise causing the distorted pulse to be applied to the electrode at the time point determined.

In some examples, the attenuation is of high-frequency components.

DETAILED DESCRIPTION

Terminology

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. Besides semiconductor wafers, other work pieces that may take advantage of the disclosed embodiments include various articles such as printed circuit boards, magnetic recording media, magnetic recording sensors, mirrors, optical elements, display devices or components such as backplanes for pixelated display devices, flat-panel displays, micro-mechanical devices and the like. The work piece may be of various shapes, sizes, and materials.

A "semiconductor device fabrication operation" as used herein is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such an etch process may etch a stack of layers in the substrate.

"Manufacturing equipment" refers to equipment in which a manufacturing process takes place. Manufacturing equipment often has a process chamber in which the workpiece resides during processing. Typically, when in use, manufacturing equipment performs one or more semiconductor device fabrication operations. Examples of manufacturing equipment for semiconductor device fabrication include deposition reactors such as electroplating cells, physical vapor deposition reactors, chemical vapor deposition reactors, and atomic layer deposition reactors, and subtractive process reactors such as dry etch reactors (e.g., chemical and/or physical etch reactors), wet etch reactors, and ashers.

An "electrostatic chuck" (ESC) as used herein refers to a chuck that uses electrostatic force to clamp a wafer to the chuck during processing. The ESC may use one or more electrodes. Voltages may be applied to each of the one or more electrodes. The applied voltage may cause current to flow, thereby causing charge to migrate through a dielectric layer between the chuck and a wafer or substrate being processed. Opposite charges accumulated at an electrode relative to the wafer therefore cause the wafer to be gripped or clamped to the chuck by the electrostatic force. In some cases, the electrodes may be integrated into the ESC, or may be separate from the ESC. In some embodiments, the ESC may refer to the electrodes the generate the electrostatic force.

A "platen" as used herein refers to a top surface of an ESC on which a wafer undergoing fabrication is positioned. There may be a gap between the wafer and the platen surface (e.g., the upper surface).

A "pedestal" as used herein may refer to a structure or housing that supports, or includes, the platen.

A "high slew rate" pulse as used herein generally refers to a pulse that is substantially square in shape. It should be understood that a "high slew rate pulse" and a "substantially square pulse" are generally used interchangeably herein. In some embodiments, a substantially square pulse (e.g., a pulse having a high slew rate) may have a slew rate within a range of about 400 Volts/microsecond-600 Volts/microsecond. In one example, a substantially square pulse may have a slew rate of about 500 Volts/microsecond.

Pre-Distortion of Pulses for Wafer Biasing

It may be desirable to bias a wafer undergoing fabrication using a plasma deposition process by imparting a high slew rate (e.g., substantially square) pulse to the wafer. For example, a high slew rate pulse may be used to select or control mass species of plasma that are attracted to or repelled from a substrate of the wafer. Selection or control of mass species may be useful, for example, for formation of a hard mask (e.g., an ashable hard mask) used for selective etching or high aspect ratio etching. Hard masks, such as ashable hard masks, may be formed during a plasma enhanced chemical vapor deposition (PECVD) process. It may be desirable for such a hard mask to have a relatively low hydrogen content. For example, a lower hydrogen content may allow the hard mask to withstand a higher etching rate during an etching process. Accordingly, repulsion of hydrogen ions during formation of a hard mask may allow a hard mask to be formed with a lower hydrogen content. Moreover, a hard mask with lower hydrogen content may facilitate the formation of $sp^3$ carbon bonds relative to $sp^2$ carbon bonds. Hard masks having relatively high $sp^3$ carbon content may possess high etch selectivity when using the hard mask during an etching process.

A high slew rate pulse may be applied to an electrode associated with a pedestal (e.g., a pedestal that supports an ESC). A substrate (e.g., a wafer undergoing fabrication) is positioned on an upper surface of a platen. There may be attenuation of an input signal (e.g., a high slew rate pulse) applied to the electrode. For example, the path from the electrode through the substrate may have a transfer function that corresponds to a substantially low-pass filtering effect. The low-pass filtering effect may be due, for example, to effective resistances and/or capacitances within a platen the substrate is positioned on and/or effective resistances and/or capacitances of a gap between an upper surface of the platen and the substrate. Accordingly, a high slew rate pulse applied to the electrode may effectively no longer be a high slew rate pulse when imparted to the wafer. In other words, the pulse applied to the electrode may be substantially square, but, due to the effect of the attenuation, the pulse as imparted to the wafer may have a rounded pulse shape due to attenuation of the square edges of the pulse that was applied to the electrode.

Methods, systems, and apparatuses for distorting pulses such that a distorted pulse at least partially compensates for attenuation between a pedestal and a substrate are described herein. In some embodiments, a pulse to be imparted to the wafer may be distorted such that a distorted pulse is applied to an electrode associated with a pedestal (e.g., a pedestal associated with an ESC), which, as a result of the transfer function that indicates an attenuation between the pedestal and the substrate, results in a waveform that, when imparted to the substrate, has a desired shape that is different from the shape of the distorted pulse that was applied. For example, in some embodiments, the desired shape may be a substantially square shape. Continuing with this example, in some embodiments, a distorted pulse applied to the electrode may have high-frequency components boosted or amplified relative to the high-frequency components of the waveform imparted to the wafer. As a more particular example, in some embodiments, the distorted pulse may have an overshoot of a rising edge and/or an undershoot of a falling edge relative to the waveform imparted to the wafer.

A distorted pulse which at least partially compensates for attenuation between a pedestal and a substrate may result in a waveform that, when imparted to the substrate, is substantially square. For example, the waveform may have a rising edge and/or a falling edge with a slew rate within a range of about 400 Volts/microsecond-600 Volts/microsecond. In one example, the slew rate may be about 500 Volts/microsecond. In some embodiments, the distorted pulse may have a magnitude within a range of about 1.0 keVolts-2.5 keVolts. In some embodiments, the distorted pulse may be part of a periodic waveform and/or pulse train. In some embodiments, the periodic waveform and/or pulse train may have a repetition frequency within a range of about 10 KHz-50 KHz. In some embodiments, the periodic waveform and/or the pulse train may have a duty cycle within a range of about 50%-90%.

In some embodiments, parameters associated with the distorted pulse, such as an amount of overshoot of a rising edge or falling edge relative to the waveform imparted to the wafer and/or a magnitude of amplification of high frequency components may be determined based on a net transfer function that indicates a transformation of an input signal applied at an electrode through a substrate (e.g., a wafer undergoing fabrication). For example, in some embodiments, the parameters associated with the distorted pulse may be determined based on an inverse of the net transfer function. As a more particular example, in some embodiments, the parameters associated with the distorted pulse may be determined by multiplying a frequency domain representation of the pulse to be imparted to the substrate and a frequency domain representation of the inverse of the net transfer function. In other words, a desired pulse (i.e., the waveform imparted to the wafer) may be "ran backwards" through the net transfer function to obtain a distorted pulse that, when applied through the net transfer function will yield the desired pulse to be imparted to the substrate.

In some embodiments, a net transfer function may be determined based on a lumped-element model that incorporates: 1) a transfer function between an electrode and the substrate; and/or 2) an effect of plasma impedance (e.g., due to plasma present during fabrication of a wafer). In some embodiments, the transfer function between the electrode and the substrate may be empirically determined using various input and output test signals. In some embodiments, the output test signals may be measured using a spectrum analyzer. In some embodiments, the plasma impedance may be modeled using a lumped-element model (e.g., as one or more resistors, as one or more capacitors, as one or more diodes in parallel with one or more capacitors, or the like). In some embodiments, the net transfer function may be determined by fitting parameters of a lumped-element model that represents the coupling of the electrode to the substrate and then augmenting the lumped-element model with a second lumped-element model that represents plasma impedance.

It should be noted that, as used herein, a transfer function may be any suitable characterization of a transformation of an input signal (e.g., applied at an electrode) to an output signal (e.g., as imparted to a substrate). A transfer function may be determined using any suitable combination of empirical data, a model with parameters fit using empirical data (e.g., a regression, or the like), a machine learning model that predicts an output signal for a particular input signal, lumped parameter modeling, parameter estimate, one or more computational simulations, and/or system identification. Example types of machine learning models that may be used include a regression, a neural network, or the like. In some embodiments, a transfer function (or a net transfer function) may be determined by applying a computational simulation and/or a machine learning model to an estimate of a transfer function that is based on a plasma impedance model.

In some embodiments, parameters associated with a net transfer function (or associated with an inverse of a net transfer function) may be stored in a memory device that may be accessed during fabrication of a wafer. For example, a controller may determine pulse parameters associated with a high slew rate (i.e., substantially square) pulse to be imparted to a wafer undergoing fabrication. Continuing with this example, the controller may retrieve parameters associated with the net transfer function or associated with the inverse net transfer function. The controller may then determine modification parameters used to distort a pulse to be imparted to the wafer that characterize a distorted pulse to be applied to an electrode to effectively impart a desired waveform to the substrate. For example, the modification parameters may be determined by applying the desired waveform to the inverse net transfer function to determine a pulse shape of a distorted pulse to be applied to the electrode. Additionally or alternatively, in some embodiments, one or more modification parameters may be stored in memory for a set of waveforms to be imparted to a substrate. In some such embodiments, the controller may retrieve the one or more modification parameters applicable to a waveform to be imparted to the wafer from memory without having to apply the desired waveform to the inverse of the net transfer function.

In some embodiments, a distorted pulse may be applied to an electrode using a broad spectrum analyzer. For example, the broad spectrum analyzer may boost or amplify one or more frequency components (e.g., relatively high frequency components associated with a rising edge and/or falling edge of a pulse) of a distorted pulse. In some embodiments, a memory device as described above, a controller that identifies parameters of a distorted pulse and/or that causes a broad spectrum amplifier to generate such a distorted pulse, and/or the broad spectrum amplifier may be associated with and/or incorporated into a power supply of an ESC.

Figure 1A:
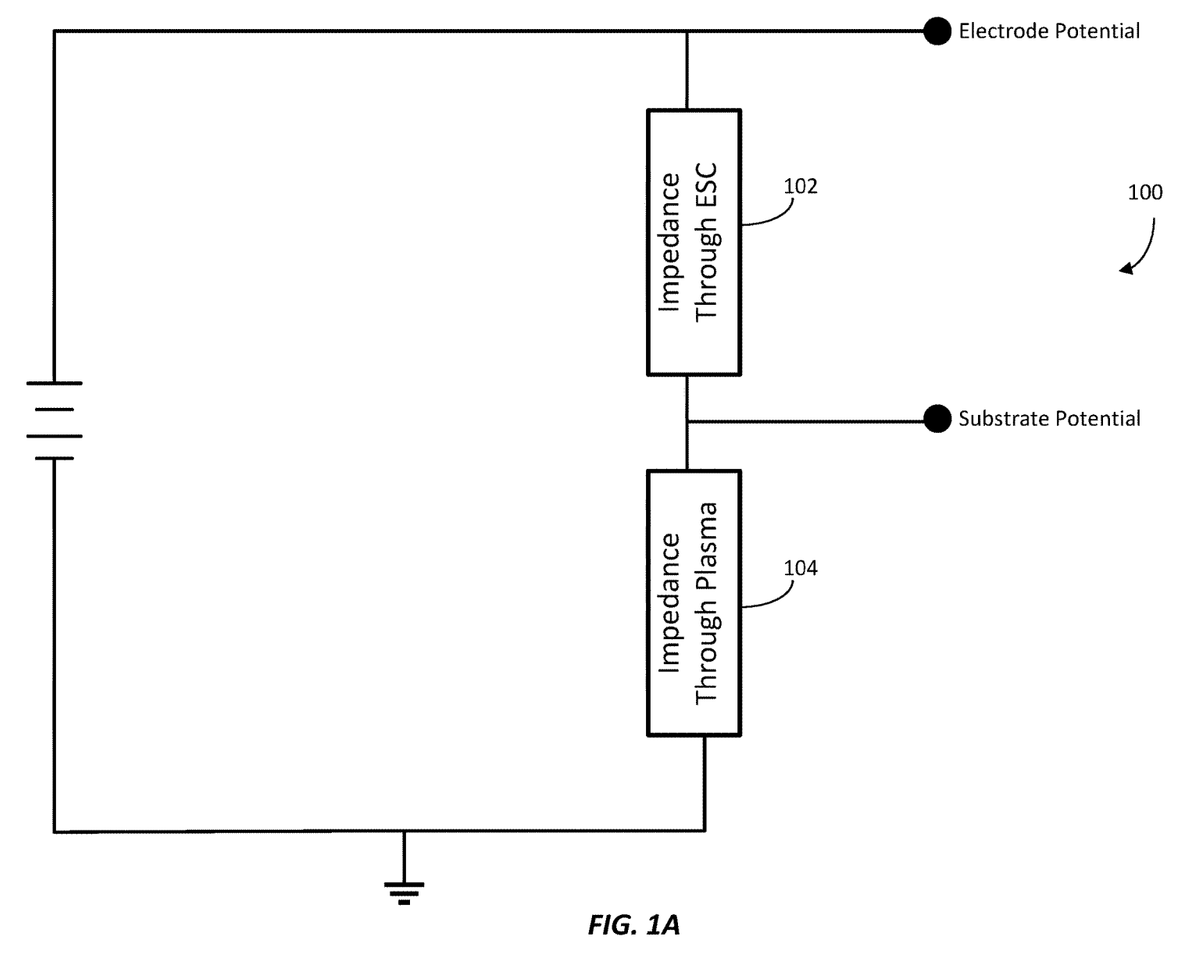
FIGS. 1A and 1B present schematic diagrams of example systems in which distortion of pulses can be implemented in accordance with some embodiments.

FIG. 1A shows a schematic diagram 100 of an example system in which distortion of pulses for wafer biasing can be implemented in accordance with some embodiments. As illustrated, the system may be characterized by an impedance 102 through an ESC and an impedance 104 through plasma. Impedances 102 and 104 may each have resistive and/or capacitive components, as described below in more detail in connection with FIG. 1B. In some embodiments, a pulse applied to an electrode, due to impedances 102 and/or 104, when imparted to a substrate, may be attenuated (e.g., high-frequency components may be attenuated).

Figure 1B:
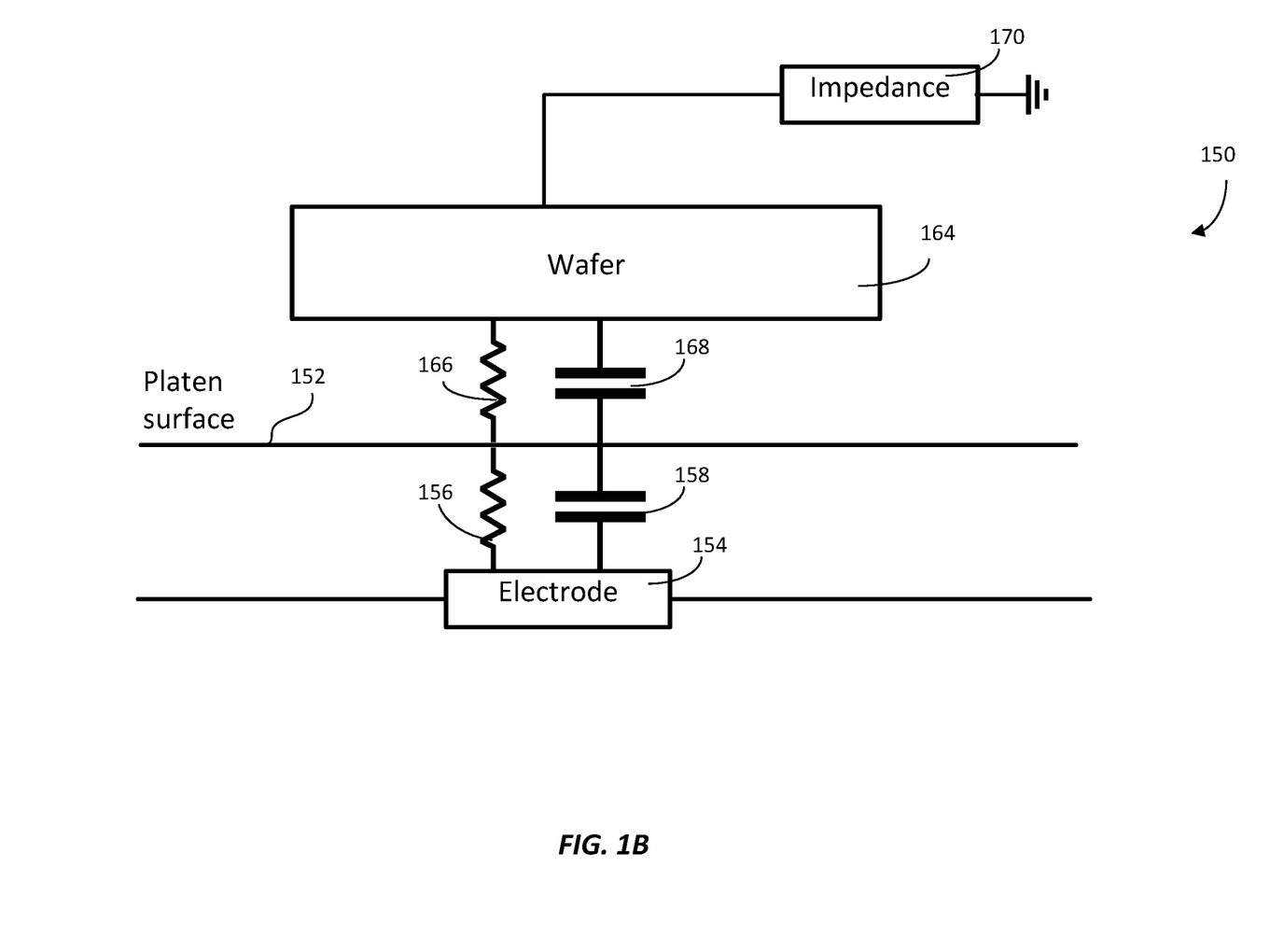

FIG. 1B shows a schematic diagram 150 of an example system in which distortion of pulses for wafer biasing can be implemented in accordance with some embodiments.

An ESC can have a platen surface 152. The ESC may have one or more electrodes (e.g., one, two, four, ten, etc.), such as electrode 154 shown in FIG. 1B. In some embodiments, a pulse may be applied to electrode 154. For example, the pulse may be applied via a broad spectrum amplifier. Resistance from electrode 154 to platen surface 152 is depicted as resistor 156. Capacitance from electrode 154 to platen surface 152 is depicted as capacitor 158. In some embodiments, capacitor 158 may be within a range of about 50 pF-700 pF, within a range of about 150 pF-500 pF, within a range of about 200 pF-400 pF, or the like.

A wafer 164 having a substrate may be positioned on platen surface 152 during fabrication. The resistance between platen surface 152 and wafer 164 is depicted as resistor 166. The resistance(s) between platen surface 152 and wafer 164 may be dependent on various parameters, such as temperature, incoming films on the substrate, and/or pre-deposited films on the platen. The capacitance between platen surface 152 and wafer 164 is depicted as capacitor 168. Values of the capacitance between platen surface 152 and wafer 164 may depend on various parameters, such as a lateral position of wafer 164, an amount of bowing of wafer 164, or the like. In some embodiments, a pulse may be applied at electrode 154 to bias wafer 164 during fabrication of wafer 164.

Wafer 164 may undergo a fabrication process that utilizes plasma for deposition, such as a Plasma-Enhanced Chemical Vapor Deposition (PECVD) process. In some such instances, a plasma comprised of reacting gases may be in a space (e.g., a space of a process chamber) above wafer 164. In some embodiments, the plasma may be characterized by a plasma impedance 170. Plasma impedance 170 may vary based on a state of the plasma, for example, whether the plasma is an activated state or in an afterglow (i.e., decaying) state. In some embodiments, plasma impedance 170) may be modeled, for example, as a lumped-element model. For example, in some embodiments, plasma impedance 170 may be modeled as one or more resistors. As another example, in some embodiments, plasma sheaths may be modeled as one or more capacitors. As yet another example, in some embodiments, non-linear phenomena associated with plasma sheaths may be modeled as one or more capacitors in parallel with one or more diodes.

It may be desirable to impart a high slew rate pulse (e.g., a substantially square pulse) to a substrate (e.g., a wafer undergoing a fabrication process that utilizes plasma for deposition), such as to wafer 164 of FIG. 1B. However, a high slew rate pulse applied to an electrode of an ESC (e.g., applied to electrode 104 via input 110, as shown in FIG. 1) may have high-frequency components effectively attenuated due to a low-pass filtering effect that occurs between the electrode and the wafer. For example, referring to FIG. 1B, a combination of resistors 156 and 166 and capacitors 158 and 168 may effectively produce a low-pass filtering effect. Therefore, a pulse that may have been substantially square when applied to an electrode may have a rounded shape when imparted at the wafer.

Figure 2A:
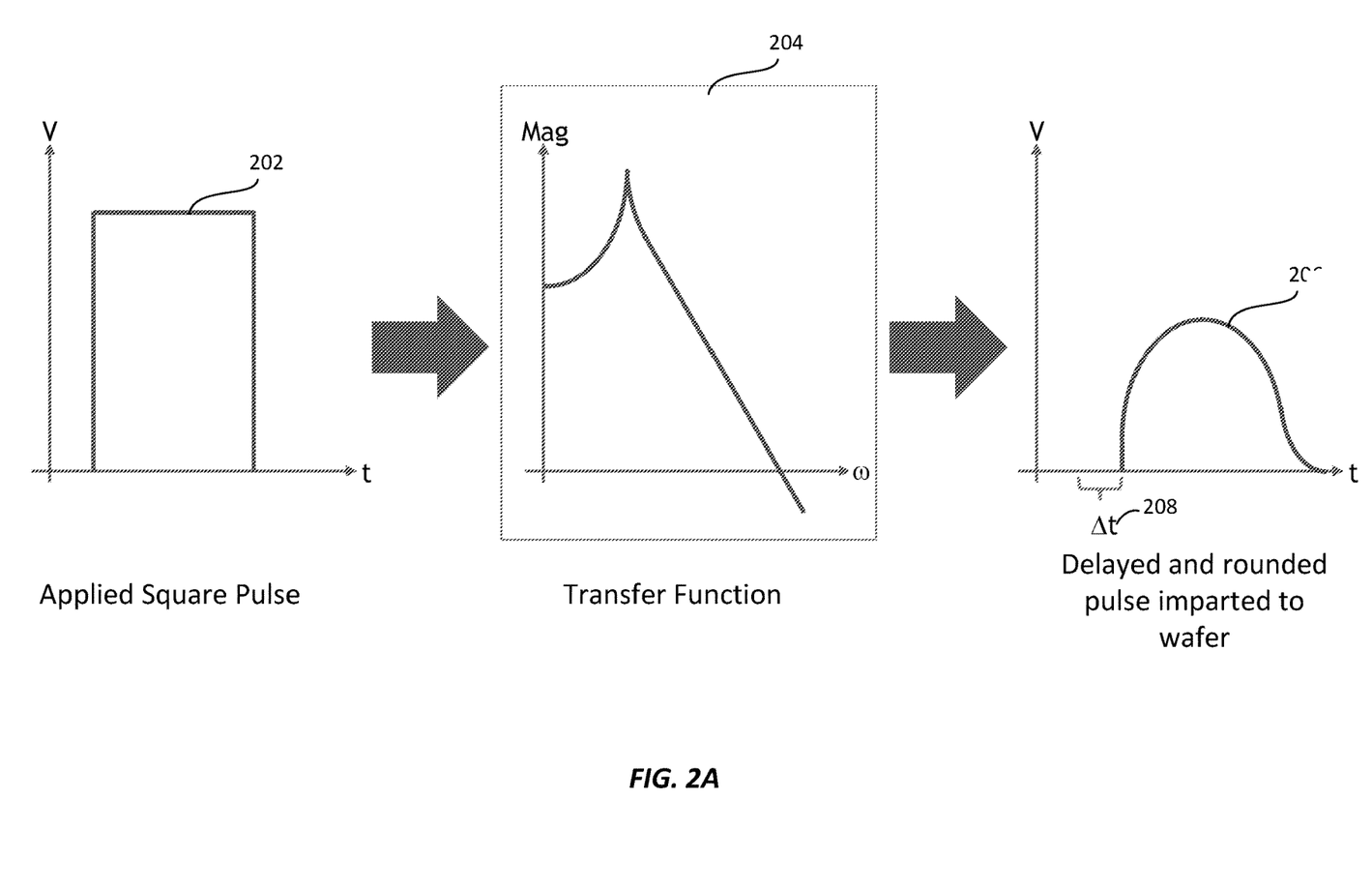
FIGS. 2A and 2B show examples representations of input pulses and corresponding pulses imparted to wafers in accordance with some embodiments.

FIG. 2A shows an example representation of an input pulse and a corresponding pulse at a wafer after undergoing a low-pass filtering effect in accordance with some embodiments. As illustrated in FIG. 2A, a square pulse 202 (e.g., a DC pulse) may be applied at an input side coupled to an electrode, such as input 110 of FIG. 1. Square pulse 202, from the input to the wafer, undergoes a transformation characterized by a transfer function 204. As illustrated, transfer function 204 may have a low-pass filtering effect. Transfer function 204 may therefore cause relatively high-frequency components, such as those associated with a rising edge and/or a falling edge of square pulse 202, to be attenuated. Referring back to FIG. 1B, transfer function 204 may be at least partially determined based on resistors 156 and 166, capacitors 158 and 168, and/or impedance 170. Due to the transformation of square pulse 202 characterized by transfer function 204, the wafer is effectively imparted with a rounded pulse 206. Rounded pulse 206 may have a delay 208, denoted as Δt in FIG. 2A. In some embodiments, delay 208 may also be characterized by transfer function 204.

In some embodiments, by applying a desired pulse to be imparted to a wafer through an inverse of the transfer function (e.g., an inverse of transfer function 204, as shown in FIG. 2A), it may be possible to determine a modified, or distorted pulse that, when applied at an electrode, effectively yields the desired pulse at the wafer by compensating for attenuation between a pedestal (e.g., an ESC) and a substrate. In some embodiments, the modified, or distorted pulse, may effectively have sharpened high-frequency components relatively to a desired square pulse shape. In other words, by effectively boosting or amplifying the high-frequency components, when a distorted pulse undergoes a transformation characterized by a low-pass filtering transfer function, the pulse as imparted to the wafer may have a relatively higher slew rate (e.g., the pulse applied to the wafer may be substantially square) compared to an undistorted pulse.

Figure 2B:
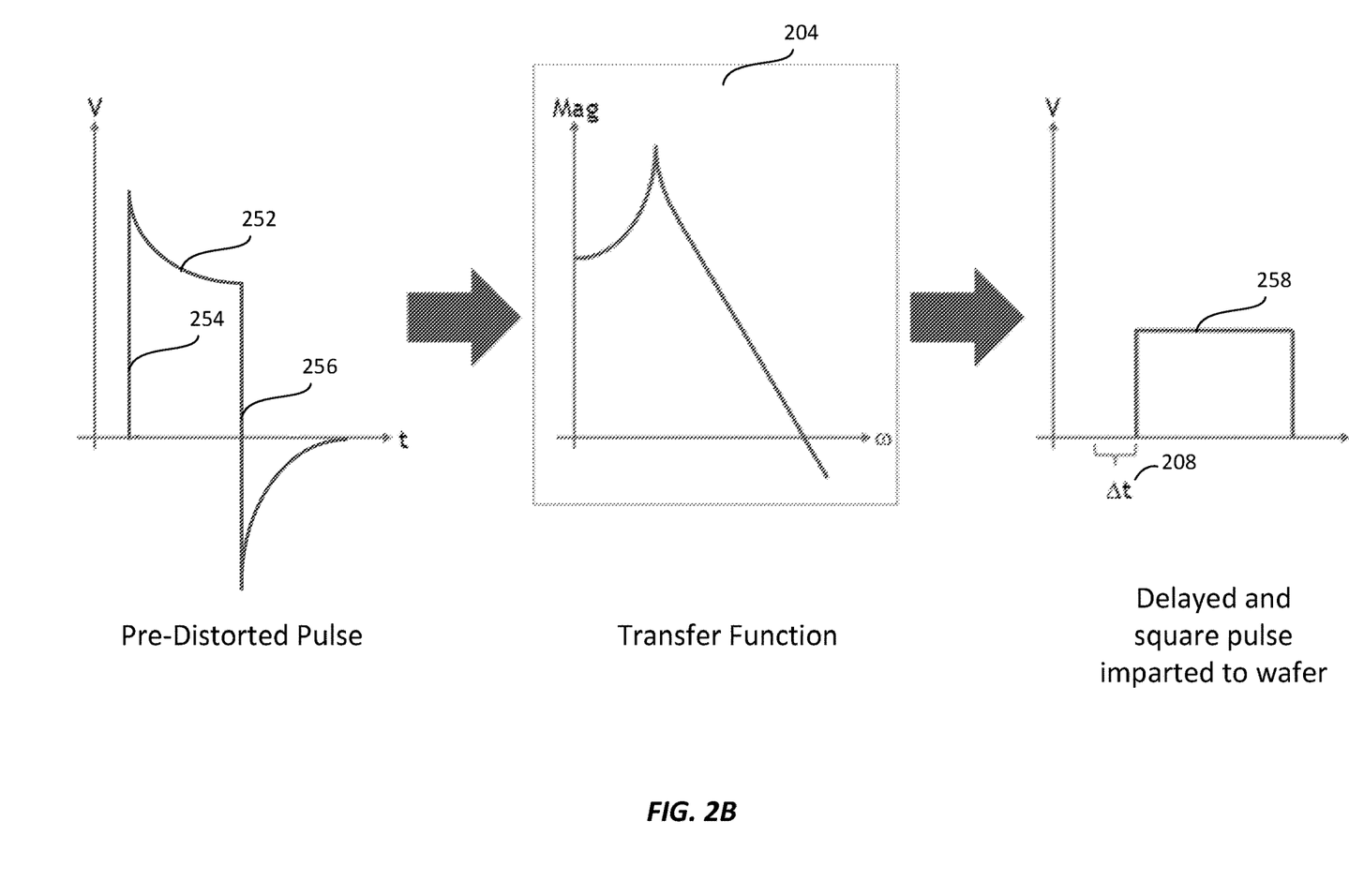

FIG. 2B shows an example representation of a distorted input pulse and a corresponding pulse at a wafer after undergoing a low-pass filtering effect in accordance with some embodiments. As illustrated in FIG. 2B, a distorted pulse 252 may be applied at an electrode, such as electrode 154 of FIG. 1B. It should be noted that distorted pulse 252 may have boosted high-frequency components relative to, for example, square pulse 202 as shown in FIG. 2A. For example, as illustrated in FIG. 2B, distorted pulse 252 may have an overshoot rising edge 254 and/or an undershoot falling edge 256. When undergoing a transformation characterized by transfer function 204, distorted pulse 252 is transformed to a square pulse 258 (e.g., the desired waveform), as imparted to the wafer. As illustrated, square pulse 258 has delay 208. Similar to what is described above in connection with FIG. 2A, delay 208 may be characterized by transfer function 204.

Figure 3A:
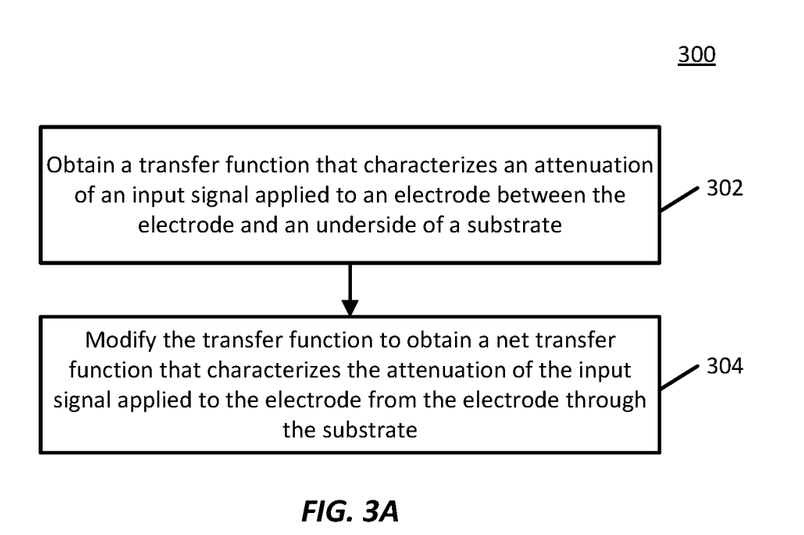
FIG. 3A shows an example of a process for determining and/or generating a transfer function that can be used to generate distorted pulses in accordance with some embodiments.

FIG. 3A shows an example of a process 300 for determining a transfer function characterizing a pulse applied to an electrode through a substrate undergoing fabrication in accordance with some embodiments.

At 302, process 300 can obtain a transfer function that characterizes an attenuation of an input signal applied to an electrode between the electrode and an underside of a substrate. In some embodiments, the transfer function may be a frequency-domain function that indicates a magnitude of various frequency components of an output signal as a result of the transformation. In some embodiments, the electrode may be associated with a pedestal, such as a pedestal of an ESC.

In some embodiments, the transfer function may be determined based at least in part on empirical data. For example, in some embodiments, an output signal at an underside of the substrate may be measured, and the transfer function may be determined based on the output signal and the input signal. In some embodiments, the empirical data may be measured using an aluminized wafer. As a more particular example, in some embodiments, the transfer function may be determined by transforming the input signal and the output signal to a frequency domain representation. Continuing with this more particular example, the transfer function may be determined by dividing the frequency domain representation of the output signal by the frequency domain representation of the input signal. Frequency domain representations of the input signal and/or the output signal may be determined using, e.g., a Discrete Fourier Transform, and/or other techniques.

In some embodiments, the output signal may be empirically measured using a spectrum analyzer. In some embodiments, the spectrum analyzer may be operatively coupled to, for example, a nickel rod. The nickel rod may in turn operatively coupled to the electrode. The output signal measured by the spectrum analyzer may therefore effectively represent the signal at the underside of the substrate.

At 304, process 300 can modify the transfer function to obtain a net transfer function. The net transfer function may indicate a transformation of the input signal from the electrode through the substrate. For example, the net transfer function may effectively incorporate an effect of plasma impedance. It should be noted that, in some embodiments, the empirical data used to obtain the transfer function described above in connection with block 302 may be measured using a dummy impedance that represents the effect of the plasma impedance. In some such embodiments, block 304 may be omitted, as the transfer function obtained at block 304 itself incorporates the effect of the plasma impedance.

The transfer function may be modified based on a model of the plasma impedance. For example, as described above in connection with FIG. 1, plasma impedance may be modeled using one or more lumped-element models. In one example, the plasma impedance may be modeled as one or more resistors. In another example, the impedance of one or more plasma sheaths may be modeled as one or more capacitors. In yet another example, non-linear effects of the impedance of one or more plasma sheaths may be modeled as one or more diodes in parallel with one or more capacitors.

In some embodiments, the net transfer function may be obtained by fitting parameters of a lumped-element model based on an empirically-derived transfer function that represents the transformation of an input signal from an electrode to an underside of the substrate (e.g., as obtained at block 302). The lumped-element model may then be augmented based on the model of the plasma impedance. The net transfer function may then be generated based on the augmented lumped-element model. For example, the net transfer function may be generated based on numerical simulations of simulated output signals for corresponding simulated input signals applied to the augmented lumped-element model.

It should be noted that, in some embodiments, two or more net transfer functions may be obtained. For example, a first net transfer function may correspond to a first time period or instance in which the plasma is in an excited or activated state, and a second net transfer function may correspond to a second time period or instance in which the plasma is in an afterglow state. In some such embodiments, two or more net transfer functions may be obtained by augmenting the same transfer function obtained at block 302 (e.g., that represents a transformation of an input signal from the electrode to the underside of the wafer) with different models of plasma impedance.

Additionally, it should be noted that parameters of the net transfer function may be calculated and stored for future use for distortion of pulses, for example, as used in process 350) described below in connection with FIG. 3B. For example, the parameters may include magnitudes of attenuation for various frequency components. In some embodiments, the parameters of the net transfer function may be determined using a programming language, such as MATLAB, Python, or the like. The parameters may be stored in a memory device accessible by a controller that causes a distorted pulse to be applied to an electrode, as described below in connection with FIG. 3B.

Figure 3B:
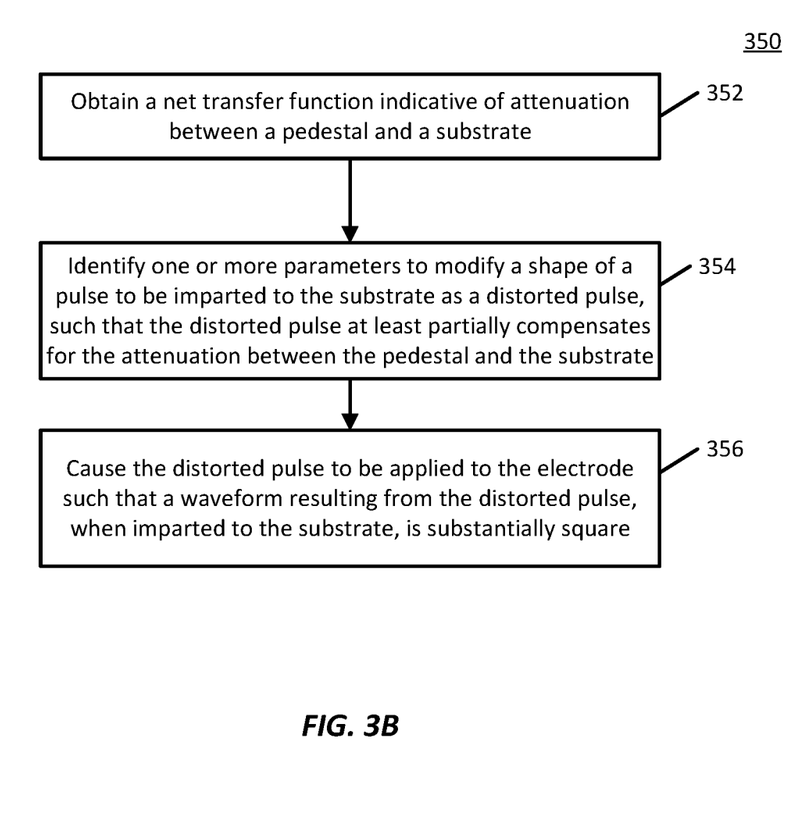
FIG. 3B shows an example of a process for generating distorted pulses based on a transfer function in accordance with some embodiments.

FIG. 3B shows an example of a process 350 for generating a distorted pulse in accordance with some embodiments.

At 352, process 350) can obtain a net transfer function indicative of attenuation between a pedestal and a substrate. For example, in some embodiments, process 350) can retrieve one or more parameters that characterize the net transfer function from a memory device that stores the one or more parameters. It should be noted that process 350 may obtain a net transfer function that is applicable to a plasma state at which a pulse is to be applied. For example, in an instance in which a pulse is to be applied when plasma is in an excited or activated state, process 350) may obtain a net transfer function relevant to excited or activated plasma (e.g., that has been determined using a plasma impedance model relevant to plasma in an excited or activated state). As another example, in an instance in which a pulse is to be applied when plasma is in an afterglow state, process 350 may obtain a net transfer function relevant to plasma in an afterglow state (e.g., that has been determined using a plasma impedance model relevant to plasma in an afterglow state).

At 354, process 350) can identify one or more parameters to modify a shape of a pulse to be imparted to the substrate as a distorted pulse, such that the distorted pulse at least partially compensates for the attenuation between the pedestal and the substrate (e.g., as indicated in the net transfer function). In some embodiments, the one or more parameters may include an amount of overshoot of a rising edge of the distorted pulse and/or an amount of undershoot of a falling edge of the distorted pulse. Additionally or alternatively, in some embodiments, the one or more parameters may include time shift information that indicates a duration by which the distorted pulse is to be applied to the electrode ahead of a time at which the pulse is to be imparted to the wafer. In effect, the duration may compensate for a time delay of the pulse arriving at the substrate relative to a time the pulse is applied at the electrode, as shown in and described above in connection with FIGS. 2A and 2B. By way of example, in an instance in which the time delay is known to be 200 microseconds, and at which the pulse is to be imparted to the wafer at time t, process 350 can determine that the pulse is to be applied at the electrode at time t−200 microseconds.

In some embodiments, the one or more modification parameters may be determined by determining a distorted pulse such that, when applied to the electrode and when undergoing the transformation indicated by the net transfer function, generates a desired waveform (e.g., a desired pulse shape) to be imparted to the substrate. The desired waveform may be pre-processed using the net transfer function to determine the distorted pulse needed to yield the desired waveform. For example, the desired waveform may be applied to an inverse of the net transfer function. For example, in some embodiments, process 350 may multiply a frequency domain representation of the desired waveform by a frequency domain representation of the inverse of the net transfer function. In other words, process 350 may divide a frequency domain representation of the desired waveform by a frequency domain representation of the net transfer function. As another example, in some embodiments, process 350) may perform a deconvolution between a time domain representation of the net transfer function and a time domain representation of the desired waveform. It should be noted that, in some embodiments, pulse parameters (e.g., amplitude, duration, duty cycle, etc.) of a desired waveform or desired pulse to be imparted to the substrate may be dependent on a mass species to be attracted to or repelled from a substrate of the wafer. For example, a duration of the pulse may be determined based on an ion type (e.g., hydrogen, helium, or the like) that is to be accelerated as a result of the pulse. As a more particular example, relatively longer duration pulses may be used to accelerate relatively heavier ions. Conversely, relatively shorter duration pulses may be used to accelerate relatively lighter ions and to inhibit acceleration of relatively heavier ions.

It should be noted that, in some embodiments, the one or more modification parameters may be determined for one or more potential pulses to be applied to the substrate and may be stored in a memory device. The one or more modification parameters relevant to the pulse parameters identified at block 354 may be retrieved from the memory device. The one or more modification parameters may be modified using any suitable heuristics. By way of example, in an instance in which the desired waveform to be imparted to a wafer is a square pulse having an amplitude of 100 microvolts and a duration of 10 microseconds, process 350 may retrieve pre-stored modification parameters for generating a distorted pulse that will yield a square pulse having an amplitude of 120 microvolts and a duration of 10 microseconds. Continuing with this example, process 350 may then modify the retrieved pre-stored modification parameters that may, for example, decrease an amplitude of the pulse applied to the wafer undergoing fabrication. Process 350 may modify retrieved, pre-stored modification parameters to adjust an amplitude of a pulse to be applied to a wafer, a duration of a pulse to be applied to a wafer, or the like.

Additionally, it should be noted that, in some embodiments, the one or more modification parameters may compensate for blockage of a DC component of the pulse applied at the electrode. For example, a portion of the DC component may be blocked (e.g., due to resistances and/or capacitances through the platen and/or between the platen and the wafer). In some such embodiments, the one or more modification parameters may indicate an amplitude by which the distorted pulse is to be increased in order to compensate for the portion of the DC component that is blocked.

At 356, process 300 may cause the distorted pulse to be applied to the electrode such that a waveform resulting from the distorted pulse, when imparted to the substrate, is substantially square. For example, process 300 may cause a broad spectrum amplifier to generate the distorted pulse. As a more particular example, the broad spectrum amplifier may generate the distorted pulse by amplifying or boosting one or more high-frequency components based on the one or more modification parameters.

It should be noted that the techniques described herein for imparting high slew rate pulses to wafers undergoing fabrication may be applied with any electrode configuration not shown in and described herein. For example, although FIG. 1 shows a configuration with an electrode positioned below a wafer undergoing fabrication, in some embodiments, the techniques described herein may be applied in instances in which an electrode is positioned above a wafer undergoing fabrication. As a more particular example, a net transfer function characterizing such a system may be determined as described above in connection with FIG. 3A. Continuing with this more particular example, modification parameters for generating a distorted pulse may be determined based at least in part on characteristics of the net transfer function. Continuing still further with this more particular example, the distorted pulse may be applied to the electrode above the wafer undergoing fabrication. In other words, although such a net transfer function may be different than a net transfer function obtained or determined for a system with an electrode under a wafer undergoing fabrication, a distorted pulse, generated based on the net transfer function (and/or based on an inverse of the net transfer function), may be, when imparted to the wafer, substantially square.

In some embodiments, a transfer function used to distort pulses may be updated periodically or continuously, e.g., during processing of a wafer. Updating the transfer function may allow for adaptation to various sources of drift associated with a reactor. In other words, by updating the transfer function adaptively to account for drift of the reactor, the distortion of pulses may be updated throughout wafer processing to adapt to the drift of the reactor.

In some embodiments, the transfer function may be updated based on one or more measurements associated with the apparatus. For example, the one or more measurements may include measurements from a plasma probe. As another example, the one or more measurements may include an impedance measurement, e.g., measured at a pedestal of the apparatus. In some embodiments, the transfer function may be updated using a real-time estimator. The real-time estimator may utilize the one or more measurements associated with the apparatus, for example, based on an error between predicted values and the one or more measured values.

Figure 4A:
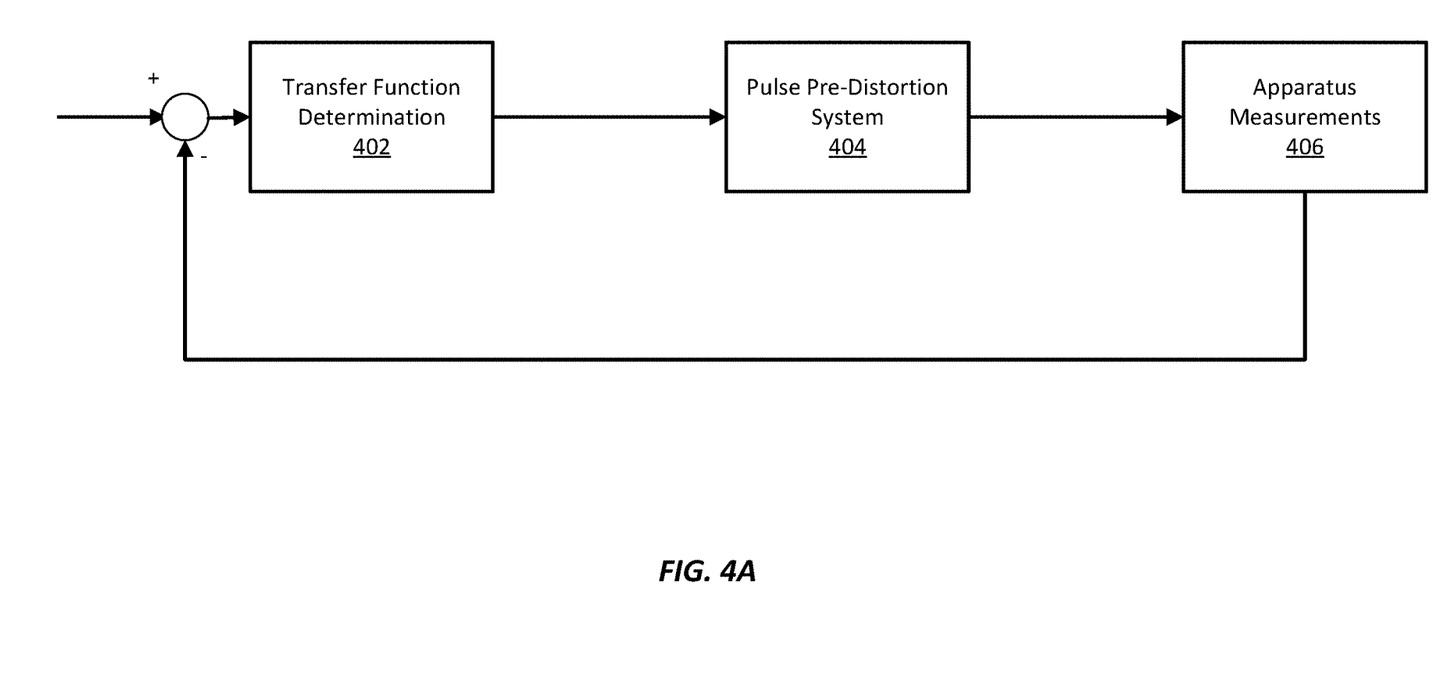
FIGS. 4A and 4B illustrate example feedback control systems for updating transfer functions for generating distorted pulses in accordance with some embodiments.
Figure 4B:
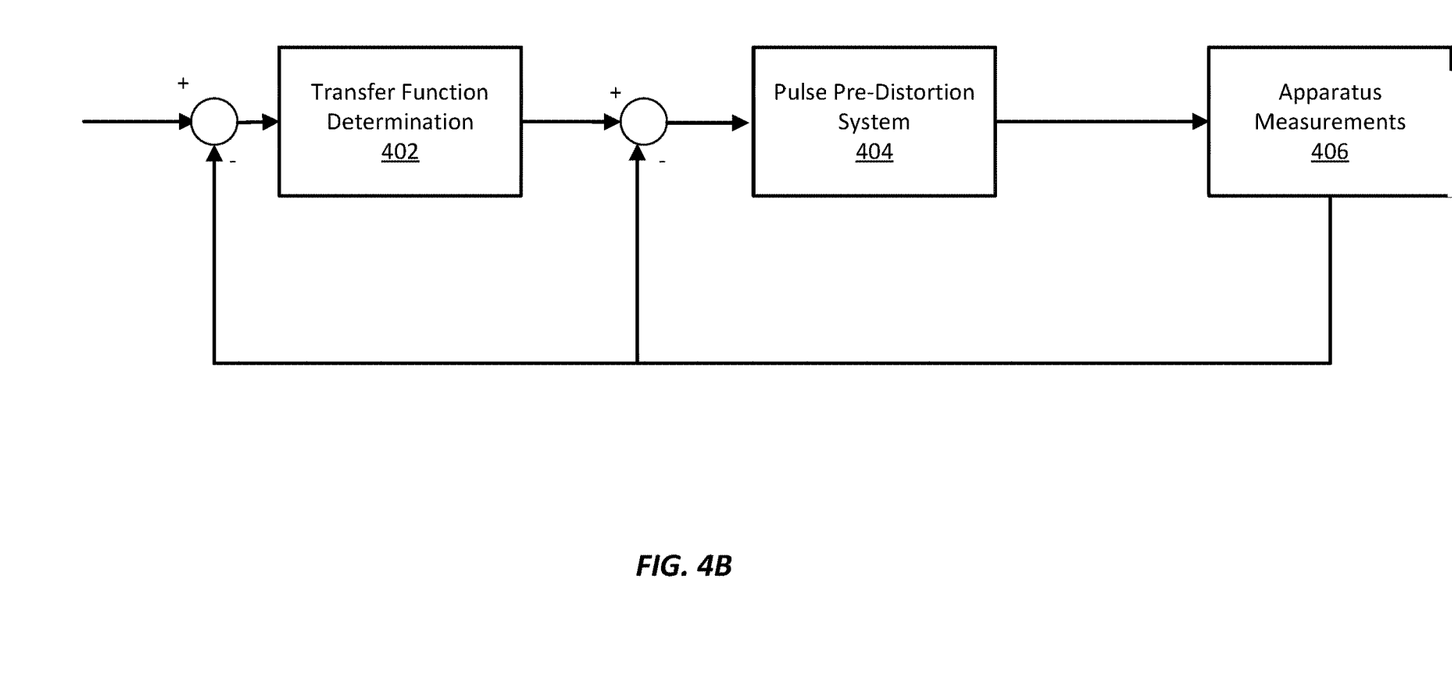

In some implementations, the transfer function may be updated (e.g., periodically or continuously) based on one or more apparatus measurements. The updated transfer function may then be utilized (e.g., during wafer processing) by a pulse pre-distortion system (e.g., a system that includes a pulse generator, or the like). For example, FIG. 4A illustrates an example system in which a transfer function is updated in accordance with some embodiments. As illustrated, transfer function determination block 402 is updated (e.g., periodically or continuously) using apparatus measurements 406. The updated transfer function may then be utilized at each iteration by the pulse pre-distortion system 404. In some implementations, both the transfer function and the pulse pre-distortion system may be updated based on one or more apparatus measurements, as illustrated in FIG. 4B. In other words, in the system illustrated in FIG. 4B, both the transfer function determination block and the pulse pre-distortion system are under closed-loop control using one or more apparatus measurements.

Context for Disclosed Computational Embodiments

Certain embodiments disclosed herein relate to computational systems for pre-distortion of pulses for wafer biasing.

Many types of computing systems having any of various computer architectures may be employed as the disclosed systems for implementing algorithms as described herein. For example, the systems may include software components executing on one or more general purpose processors or specially designed processors such as Application Specific Integrated Circuits (ASICs) or programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a technique described herein on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions: particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The methods and techniques used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include various coefficients to be used in calculations, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

System software typically interfaces with computer hardware and associated memory. In some embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 5:
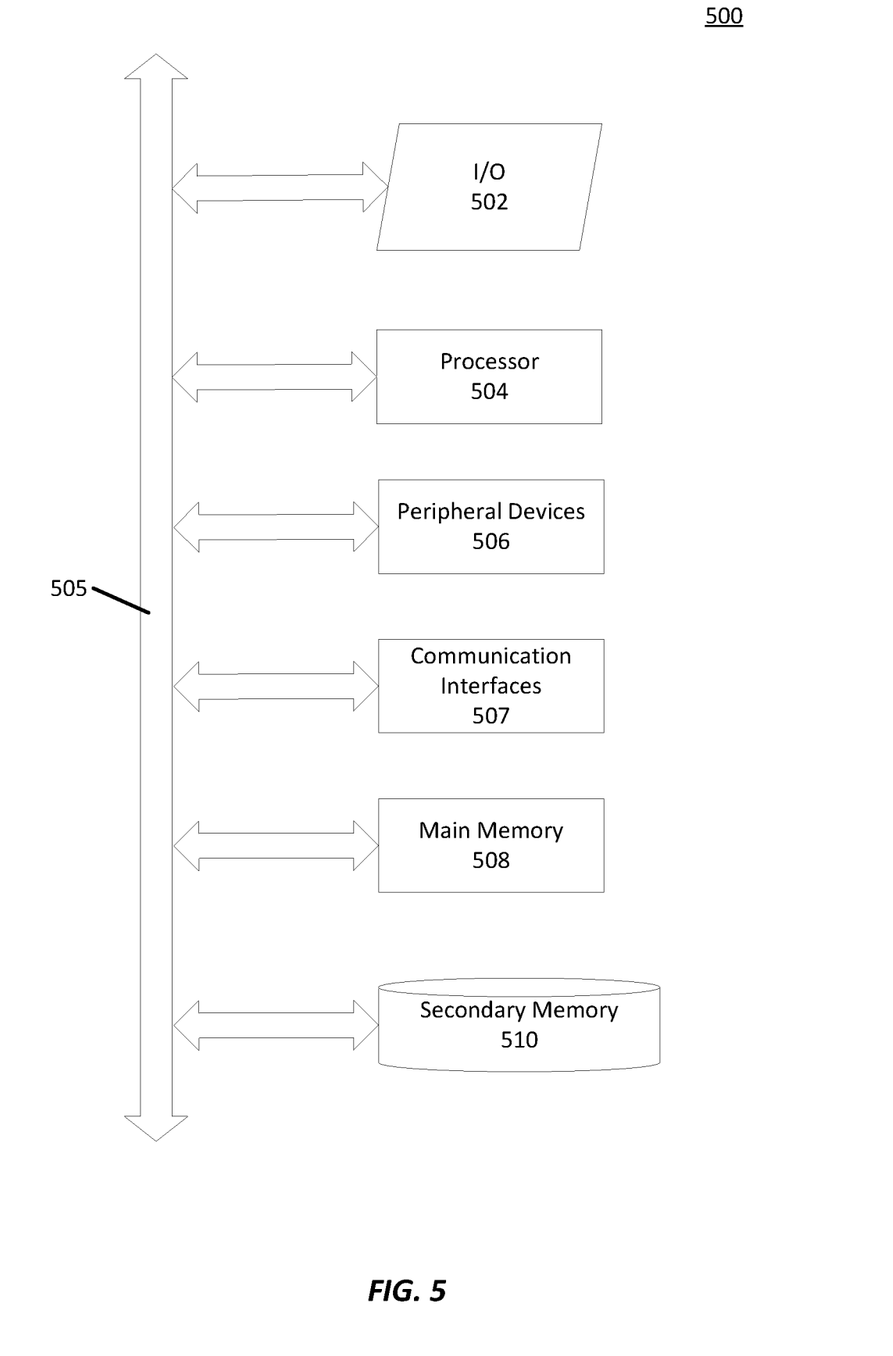
FIG. 5 presents an example computer system that may be employed to implement certain embodiments described herein.

An example computer system 500 is depicted in FIG. 5. As shown, computer system 500 includes an input/output subsystem 502, which may implement an interface for interacting with human users and/or other computer systems depending upon the application. Embodiments of the disclosure may be implemented in program code on system 500 with I/O subsystem 502 used to receive input program statements and/or data from a human user (e.g., via a GUI or keyboard) and to display them back to the user. The I/O subsystem 502 may include, e.g., a keyboard, mouse, graphical user interface, touchscreen, or other interfaces for input, and, e.g., an LED or other flat screen display, or other interfaces for output.

Communication interfaces 507 can include any suitable components or circuitry used for communication using any suitable communication network (e.g., the Internet, an intranet, a wide-area network (WAN), a local-area network (LAN), a wireless network, a virtual private network (VPN), and/or any other suitable type of communication network). For example, communication interfaces 507 can include network interface card circuitry, wireless communication circuitry, etc.

Program code may be stored in non-transitory media such as secondary memory 510 or memory 508 or both. In some embodiments, secondary memory 510 can be persistent storage. One or more processors 504 reads program code from one or more non-transitory media and executes the code to enable the computer system to accomplish the methods performed by the embodiments herein, such as those involved in determining a transfer function associated with an ESC, inverting a transfer function to determine parameters for a pulse to be applied, or the like. Those skilled in the art will understand that the processor may accept source code, such as statements for executing operations (e.g., for fitting modeling parameters, determining or inverting a transfer function, or the like), and interpret or compile the source code into machine code that is understandable at the hardware gate level of the processor. A bus 505 couples the I/O subsystem 502, the processor 504, peripheral devices 506, communication interfaces 507, memory 508, and secondary memory 510.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

Unless otherwise indicated, the method operations and device features disclosed herein involves techniques and apparatus commonly used in metrology, semiconductor device fabrication technology, software design and programming, and statistics, which are within the skill of the art.

Unless defined otherwise herein, all technical and scientific terms used herein have the same meaning as commonly understood by one of ordinary skill in the art. Various scientific dictionaries that include the terms included herein are well known and available to those in the art. Although any methods and materials similar or equivalent to those described herein find use in the practice or testing of the embodiments disclosed herein, some methods and materials are described.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

As used herein, the singular terms "a," "an," and "the" include the plural reference unless the context clearly indicates otherwise. The term "or" as used herein, refers to a non-exclusive or, unless otherwise indicated.

Various computational elements including processors, memory, instructions, routines, models, or other components may be described or claimed as "configured to" perform a task or tasks. In such contexts, the phrase "configured to" is used to connote structure by indicating that the component includes structure (e.g., stored instructions, circuitry, etc.) that performs the task or tasks during operation. As such, the unit/circuit/component can be said to be configured to perform the task even when the specified component is not necessarily currently operational (e.g., is not on).

The components used with the "configured to" language may refer to hardware—for example, circuits, memory storing program instructions executable to implement the operation, etc. Additionally, "configured to" can refer to generic structure (e.g., generic circuitry) that is manipulated by software and/or firmware (e.g., an FPGA or a general-purpose processor executing software) to operate in manner that is capable of performing the recited task(s). Additionally, "configured to" can refer to one or more memories or memory elements storing computer executable instructions for performing the recited task(s). Such memory elements may include memory on a computer chip having processing logic. In some contexts, "configured to" may also include adapting a manufacturing process (e.g., a semiconductor fabrication facility) to fabricate devices (e.g., integrated circuits) that are adapted to implement or perform one or more tasks.

What is claimed is:

1. A method for applying DC pulses to a substrate, the method comprising:
    causing a distorted pulse to be applied to an electrode of a pedestal such that the distorted pulse at least partially compensates for attenuation between the pedestal and the substrate, and such that a waveform resulting from the distorted pulse, when imparted to the substrate, has a rising edge with a slew rate within a range of about 400 Volts/microsecond-600 Volts/microsecond.

2. The method of claim 1, further comprising:
    determining a time shift at which the distorted pulse is to be applied to the electrode based at least in part on a time delay associated with propagation of the distorted pulse, wherein causing the distorted pulse to be applied to the electrode comprises causing the distorted pulse to be applied to the electrode at the time shift determined.

3. The method of claim 1, wherein the attenuation is of frequency components associated with a rising edge or a falling edge of the distorted pulse.

4. The method of claim 1, further comprising obtaining one or more parameters, wherein the distorted pulse is generated based at least in part on the one or more parameters.

5. The method of claim 4, wherein obtaining the one or more parameters comprises retrieving the one or more parameters from a memory associated with a controller that causes the distorted pulse to be applied.

6. The method of claim 1, wherein the distorted pulse is generated based at least in part on a transfer function indicative of the attenuation between the pedestal and the substrate.

7. The method of claim 6, wherein the transfer function is updated on a periodic or continuous basis, and wherein a second distorted pulse is generated based at least in part on the updated transfer function.

8. The method of claim 7, wherein the transfer function is updated based on one or more measurements associated with an apparatus in which the pedestal is disposed.

9. The method of claim 8, wherein the transfer function is updated using a real-time estimator that utilizes the one or more measurements.

10. The method of claim 8, wherein parameters associated with a pulse generator that applies the distorted pulse and the second distorted pulse are updated based at least in part on the one or more measurements.

11. An apparatus for applying DC pulses to a substrate, the apparatus comprising at least one controller that is configured to:
    cause a distorted pulse to be applied to an electrode of an Electrostatic Chuck (ESC) such that the distorted pulse at least partially compensates for attenuation between the ESC and the substrate, and such that a waveform resulting from the distorted pulse, when imparted to the substrate, has a rising edge with a slew rate within a range of about 400 Volts/microsecond-600 Volts/microsecond.

12. The apparatus of claim 11, wherein the controller is part of a power supply associated with the ESC.

13. The apparatus of claim 11, wherein the distorted pulse is generated using a broad spectrum amplifier.

14. The apparatus of claim 13, wherein the broad spectrum amplifier is configured to boost frequency components of the pulse to be imparted to the substrate, wherein the frequency components are associated with a rising edge and/or a falling edge of the pulse.

15. The apparatus of claim 11, wherein the at least one controller is further configured to obtain one or more parameters, wherein the distorted pulse is generated based at least in part on the one or more parameters.

16. The apparatus of claim 15, wherein obtaining the one or more parameters comprises retrieving the one or more parameters from a memory associated with the controller.

17. The apparatus of claim 15, wherein the one or more parameters are determined based at least in part on a transfer function indicative of the attenuation between the ESC and the substrate.

18. A method for applying DC pulses to substrates, the method comprising:
    characterizing a transfer function indicative of attenuation between pedestal and a substrate; and
    identifying one or more parameters to modify a shape of a pulse to be imparted to the substrate as a distorted pulse, such that the distorted pulse at least partially compensates for the attenuation between the pedestal and the substrate, and such that a waveform resulting from the distorted pulse, when imparted to the substrate via an electrode of the pedestal, has a rising edge with a slew rate within a range of about 400 Volts/microsecond-600 Volts/microsecond.

19. The method of claim 18, wherein the one or parameters are identified to boost frequency components of the pulse to be imparted to the substrate as the distorted pulse and/or wherein the one or more parameters are identified such that a rising edge of the distorted pulse overshoots a rising edge of the waveform resulting from the distorted pulse and/or such that a falling edge of the distorted pulse undershoots a falling edge of the waveform resulting from the distorted pulse, wherein the frequency components are associated with the rising edge and/or the falling edge.

20. The method of claim 18, wherein the transfer function is based on a plasma impedance model.

21. The method of claim 18, wherein the transfer function indicates a low-pass filtering effect of a platen of an ESC and/or the substrate positioned on an upper surface of the platen, and wherein the one or more parameters compensate for the low-pass filtering effect.

22. The method of claim 18, wherein the transfer function is characterized by at least one of: direct measurement of parameters associated with a response of the pedestal to an input signal applied to the electrode of the pedestal, lumped parameter modeling, parameter estimate, computational simulation, system identification, and/or a machine learning model.

23. The method of claim 18, wherein characterizing the transfer function comprises applying at least one of a computational simulation or a machine learning model to an estimate of the transfer function that is based at least in part on a plasma impedance model.

24. The method of claim 18, further comprising identifying one or more pulse parameters based on a fabrication process associated with the substrate, wherein the one or more parameters to modify the shape of the pulse are identified based at least in part on the one or more pulse parameters.

25. The method of claim 24, wherein the one or more pulse parameters are identified to select a mass species attracted to or repelled from the substrate as part of the fabrication process and/or wherein the one or more parameters comprise at least one of a pulse duration or a pulse amplitude.

26. A method for applying periodic waveforms to substrates, the method comprising:
causing a distorted pulse to be applied to an electrode associated with a pedestal such that the distorted pulse at least partially compensates for attenuation between the pedestal and a substrate, and such that a waveform resulting from the distorted pulse, when imparted to the substrate, has a desired shape that is different from a shape of the distorted pulse, wherein the distorted pulse is generated based at least in part on a transfer function indicative of the attenuation between the pedestal and the substrate.

27. The method of claim 26, wherein a rising edge of the distorted pulse overshoots a rising edge of the waveform resulting from the distorted pulse and/or wherein a falling edge of the distorted pulse undershoots a falling edge of the waveform resulting from the distorted pulse.

* * * * *